United States Patent [19]

Rainwater et al.

[11] Patent Number: 5,534,290
[45] Date of Patent: *Jul. 9, 1996

[54] SURROUND PRINT PROCESS FOR THE MANUFACTURE OF ELECTRODE EMBEDDED DIELECTRIC GREEN SHEETS

[75] Inventors: Jewel G. Rainwater, North Richland; Paul Benson, Graham, both of Tex.; William R. Belko, Rancho La Costa, Calif.; Robert J. Deffeyes, Dayton, Ohio; Arne B. Carlson, deceased, late of Graham, Tex., by Mildred Carlson, executrix

[ * ] Notice: The term of this patent shall not extend beyond the expiration date of Pat. No. 5,101,319.

[73] Assignee: Visatech Corporation, Syracuse, N.Y.

[21] Appl. No.: 206,756

[22] Filed: Mar. 7, 1994

Related U.S. Application Data

[63] Continuation-in-part of Ser. No. 860,063, Mar. 30, 1992, Pat. No. 5,292,548, which is a continuation-in-part of Ser. No. 504,330, Apr. 3, 1990, Pat. No. 5,101,319.

[51] Int. Cl.$^6$ ........................................ B05D 5/12
[52] U.S. Cl. .................. 427/97; 427/126.5; 427/278; 427/365; 427/376.2; 427/419.2
[58] Field of Search .................... 427/97, 126.5, 427/278, 365, 376.2, 419.2

[56] References Cited

U.S. PATENT DOCUMENTS

| | | | |
|---|---|---|---|
| 4,692,285 | 9/1987 | Bloomfield et al. | 264/22 |
| 5,101,319 | 3/1992 | Piffexes et al. | 361/321 |
| 5,194,335 | 3/1993 | Effenberger et al. | 428/421 |
| 5,292,548 | 3/1994 | Rainwater | 427/97 |
| 5,370,759 | 12/1994 | Hakotani et al. | 156/73.1 |

*Primary Examiner*—Benjamin Utech
*Attorney, Agent, or Firm*—Samuels, Gauthier & Stevens

[57] ABSTRACT

A multilayered ceramic chip capacitor. An electrode ink pattern is formed on a release film. The electrode ink pattern is calendered, densified and flattened. Dielectric material is applied to the release film and surrounds but does not cover the electrode ink to form an electrode surround printed dielectric sheet. The dielectric is calendered, densified and flattened. The densities of the electrode ink and dielectric are formulated such that after calendering the electrode ink and dielectric surfaces are substantially coplanar. A final overcoat of dielectric is applied over the surround printed dielectric sheet.

10 Claims, 2 Drawing Sheets

SURROUND PRINT PROCESS FOR THE MANUFACTURE OF ELECTRODE EMBEDDED DIELECTRIC GREEN SHEETS

CROSS-REFERENCE TO RELATED APPLICATION(S)

This application is a continuation-in-part of U.S. Ser. No. 860,063, filed Mar. 30, 1992, now U.S. Pat. No. 5,292,548 issued Mar. 8, 1994 which was a continuation-in-part of U.S. Ser. No. 504,330, filed Apr. 3, 1990, now U.S. Pat. No. 5,101,319 issued Mar. 31, 1992.

BACKGROUND OF THE INVENTION

This invention relates to a method for the manufacture of electrode embedded green sheets by a surround print process, to the electrode embedded green sheets and to electronic components made from said green sheets. Multilayered ceramic components, such as capacitors, varistors, thermistors and other multilayered circuits are exemplary of such electronic components. The invention embodies the use of electrode surround printing and coating densification techniques to produce electrode embedded green sheets which are more uniform, flatter and thinner when compared to the prior art electrode embedded green sheets. In a preferred embodiment, the green sheets are used for multi-layered ceramic capacitors (MLC).

MLC's and their structures are well known. Several manufacturing steps are employed for the production of MLC. Current manufacturing techniques favor casting a dielectric of suitable thickness, cutting the dielectric into sheets and then depositing electrodes directly onto a dielectric sheet. Subsequently, other processing steps are effected such as drying and/or compressing the green sheets. The green sheet can be stored and subsequently stripped from the release film for stacking to form a MLC. The electrode patterns of successive sheets are offset from one another. After the desired number of layers has been reached, the sheets are pressed or laminated and cut into individual capacitors, which are sintered or fired. Then, end terminations are formed on the capacitors to provide a means for physical and electrical connection to the circuit.

In each of the various stages or steps of the process, potential problems exist which can affect the quality of the finished capacitor. A critical process step is the build-up or stacking of the layers to produce a bar. This involves laying down a previously cast dielectric sheet onto a build-up stack in progress and then printing the electrode onto the dielectric sheet and drying the electrode before overlaying the print with another dielectric sheet and pressing that sheet down into the previously printed electrode. The potential problem during the build-up process is trying to achieve a uniformly high and flat electrode surface. Other major potential problems that also exist in the initial process steps are providing a dielectric layer where the average thickness and the minimum thickness approach equality and in correctly aligning and stacking the printed sheets.

The presence of bumps in the rough electrode surfaces is known to produce undesirable enhancements of the electrical fields between the dielectric layers. In addition, variations in electrode thickness reduce the dielectric thickness at the bumps to produce non-uniformity and perturbations in the electrical fields. The combination of the reduced dielectric thickness and the disturbed fields caused by the bumps leads to electrical insulation weak spots in the capacitor. Prior art electrode coatings are normally 150 micro-inches thick, are non-uniform and can vary up to 35 to 40% in thickness. These non-uniformities can result in material stresses in the finished capacitor.

Usually, the non-uniformity problem is only partially solved by applying mechanical pressure to deform the dielectric overlay sheet down onto the upper sheet of the stack since the electrode is not completely dry and has no restraint to prevent deformation which limits the amount of pressure that can be applied. Because the edges surrounding the electrode pattern have no abutting material there, the overlay sheet tends to mound up over the electrode pattern and thus, does not eliminate the problem. Further mounding to a lesser degree occurs over each of the electrodes in the pattern. As additional sheets are added and printed, the surface non-uniformity increases and eventually makes printing of a precisely located electrode pattern impossible.

Electrode embedded green sheets are well known in the art.

Wallace, U.S. Pat. No. 4,301,580, discloses embedded electrodes formed by first casting electrodes on a release sheet and then overcasting dielectric material.

Elderbaum, U.S. Pat. No. 4,008,514, discloses forming an electrode pattern on a release film, casting a green sheet over the electrode, printing a second electrode pattern on the green sheet, casting a second green sheet over the second electrode pattern and applying pressure, and then removing the printed sheets from the release film.

Elderbaum, U.S. Pat. No. 3,882,059, discloses a process for producing capacitors comprising the steps of placing an electrode pattern on a release film, placing a ceramic sheet on the pattern and release film and then peeling away the ceramic sheet and pattern from the release surface.

European Appln. 89903265.0 (Pub. No. 0 362 404) includes a detailed discussion of Japanese prior art regarding electrodes embedded in a dielectric.

The basic invention disclosed in the '319 patent was a process which provided precise surface and thickness control for electrode and dielectric layers. The electrode and dielectric layers were compacted in the green state using a calender (opposed rolls applying pressure on the greenware) at the nip point between the rolls to increase substantially the density of both the electrodes and the green body and to impart added smoothness to the deposited layers. This calendering was done layer by layer as well as after two or more layers had been formed and calendered individually or in combinations.

Another innovation disclosed in the '319 patent was to overcoat a previously deposited layer(s), such as electrodes, with a low viscosity green slurry so that the slurry flowed around the previously deposited layer filling in all open areas to a preselected thickness. The term imbedded electrode was used to describe the result of this concept.

The resulting layered green ceramic structure was then an ideal green tape (sheet) from which stacks were made (build-ups) and which upon further processing became MLC capacitors. The process avoided the need to print on top of an uneven non-dense dielectric layer which limited the number of layers in a single structure. The carrier supported material was easy to handle and with the aid of preprinted fiducials on the carrier the sheets could be accurately positioned so that the imbedded electrodes could be aligned properly to gain maximum capacitance benefit while minimizing the loss due to more off-set between the layers than was required to provide alternate layer electrical contact on each side.

In the '319 patent still another innovation was disclosed, specifically what is herein referred to in this disclosure as 'surround printing'. As set forth in FIG. 7 of the '319 patent and the corresponding description, it was recognized that there were advantages to printing the electrode pattern on a release film followed by calendering and then casting or printing the dielectric on the release film in those areas where the electrode pattern was not printed and further not overcoating the electrodes in this step of the process. This resulted in surrounding the electrodes while not overcoating the electrodes.

In the parent disclosure, U.S. Pat. No. 5,292,548, the benefits and uniqueness of using the surround-print process to manufacture other layered ceramic structures such as multi-chip modules and hybrid circuits was disclosed, specifically, the advantages of using surround printing as a means of printing conductive vias, circuits or patterns and then later surround printing dielectric around the conductive patterns. The surround printed dielectric provided good boundaries for containment of the conductor during densification which would compact the conductor as well as the dielectric and prevent or reduce the incidence of voids that might lead to discontinuities and failure. Alternatively, dielectric with voids or void patterns could be printed to be followed with fill-in printing on the conductive patterns or vias.

Making high layer count stacks for MLCs, using the prior art processes outlined in the '319 patent, resulted in the stack surfaces showing the imprint of the electrode pattern when the number of layers reached 20–40, depending upon the thickness of the electrode and the dielectric layers. As the surface non-uniformity increased, the problem of precisely locating the next electrode print became untenable. This was one of the problems that the '319 process significantly alleviated as compared to the then prior art standard processing. As was disclosed in the '319 patent, the positional accuracy would begin to diminish at some point as the number of layers increased reducing the yield. For conventionally made capacitors, depending upon the electrode and dielectric layer thickness, the dimensional perfection of the green dielectric tape and the quality of the electrode print could become a problem at 20 to 40 layers and prevented the manufacture at acceptable yields of very high layer count parts. Although the '319 process made possible the production of much higher layer count parts (60 to 100) at acceptable yields, the electrode imprint problem was not totally eliminated. This imprint was really a surface perturbation caused by the denser electrodes not compacting as much as the dielectric during densification and later during the light stacking lamination pressures. This was because the densities of the electrode and the surrounding dielectric were not the same so that one did not compact under pressure as much as the other.

Subsequently, it has been found that the use of the surround print process with calendering of the electrode followed by surround printing of the electrodes with the dielectric and calendering followed by overlay coating and final calendering, produces tape with much less tendency to exhibit the electrode print surface unevenness during stacking, even when stacks having more than 100 layers are made. Further, it has been found that bars made using the process, particularly with the surround printing, have fewer incidents of one or more layers in the stack shifting during lamination.

In conventionally built stacks, it appears that this shifting is due to the dielectric layer being somewhat suspended on the electrode printed on top of the preceding dielectric layer and being less well adhered so that, under lamination pressure, the whole layer moves to better distribute the stress. Because the use of imbedded electrodes and calendering results in more contact surface between the layers, it is believed that the disclosed process is the cause of the reduction in isolated layer shifting during the lamination step.

When the "surround print" method is used for electrodes, the boundaries of the electrodes are better contained during the compaction step than with the non-surround printed electrodes. Both the surround print dielectric layer and the dielectric overlay coating are made using the same or chemically compatible dielectric binder so that they are chemically compatible for good lamination and so that they have the same percentage compaction during calendering. The surround printing results in just as compact electrodes as generally disclosed in the '319 patent but one almost devoid of appendages or bulges which cause the electrodes to have a distorted shape. The surround printing process results in a reduction in the amount of metal used to form the rectangular shaped electrodes as no excess is necessary to allow for bulges or irregular metal flow during the densification step.

With the use of precise registration accuracy, the electrode can be printed first and then surround printed with dielectric or the dielectric with rectangular voids can be printed followed by printing the electrodes in the rectangular void spaces. If both printings are completed before being calendered the resulting "closeness" of the dielectric to the electrode is improved and the compaction level achieved is similar in both.

It has been determined that for the best results, the densities of the electrodes and the dielectric should be as close together as possible.

There are optimum range formulations for both the electrodes and the dielectric as the density of either of the products, before and after densification, is influenced by the choice of materials, the percent solids in each slurry, the particle size, the closeness of match between the dielectric theoretical density as compared to that of the electrode material and the choice of additives. These parameters are selected to ensure that the needed compaction is achieved without distortion regardless of the printing order.

The density difference between the electrodes and the dielectric can be compensated for a limited degree by printing either the electrode or the dielectric to a slightly different height so that the final densities of both, after calendering, approximate target densities. The resulting imbedded, but top exposed electrode, is overlayed with more dielectric to obtain the desired dielectric separation thickness. This technique provides an even smoother final surface to the tape so that stacking of up to 150 to 300 layers is possible while still maintaining positional accuracy.

OBJECTS OF THE INVENTION

It is an object of this invention to use high speed in-line printing, calendering and coating techniques to produce the electrode embedded dielectric sheets of the invention having superior flatness compared to prior art electrode embedded green sheets.

It is an object of the invention to surround print conductive patterns with a dielectric material.

It is another object of the invention to equalize the heights, surface smoothness and flatness of the electrodes and dielectric materials, to enhance layer to layer adhesion and positioning, to densify both the electrodes and the dielectric uniformly and to enhance the surface to surface lamination of the green sheets.

SUMMARY OF THE INVENTION

The invention broadly comprises a method for making passive multilayered electronic components and the components produced by the method. Such components, which are characterized by the necessity of having uniform, thin, flat electrodes and contrasting functional layers, include capacitors, varistors, resistors and inductors, including transformers.

In the present invention, techniques are used which result in superior uniformity and flatness of printed electrodes and thinner and flatter dielectric layers to significantly enhance the quality of the component so produced. A preferred embodiment of the invention embodies a method(s) of making multilayered ceramic capacitors.

In one aspect of the invention, an electrode pattern is printed on a release film by planar screen, rotary screen, gravure roll, offset printing, transfer printing, hot stamping, ink jet printing or other suitable techniques. This printing can be followed by a calendering step at a first pressure which flattens the electrodes creating smooth (flat) electrode surfaces eliminating the bumps or roughness generally inherent in the printing step. Next, the dielectric is surround printed about the electrodes and then optionally calendered at a second pressure. Subsequently, a dielectric layer overcoats the surround printed electrodes.

In another aspect of the invention, a dielectric layer is printed having voids therethrough in a predetermined pattern. The electrode pattern is printed in the voids. Subsequently the surround printed electrodes are calendered.

In a preferred embodiment of the invention, the electrode and dielectric materials are specially formulated to ensure compatibility regarding co-fired properties, compacted density, surface release characteristics and surface to surface lamination properties.

DESCRIPTION OF THE PREFERRED EMBODIMENT(S)

Figure 1:
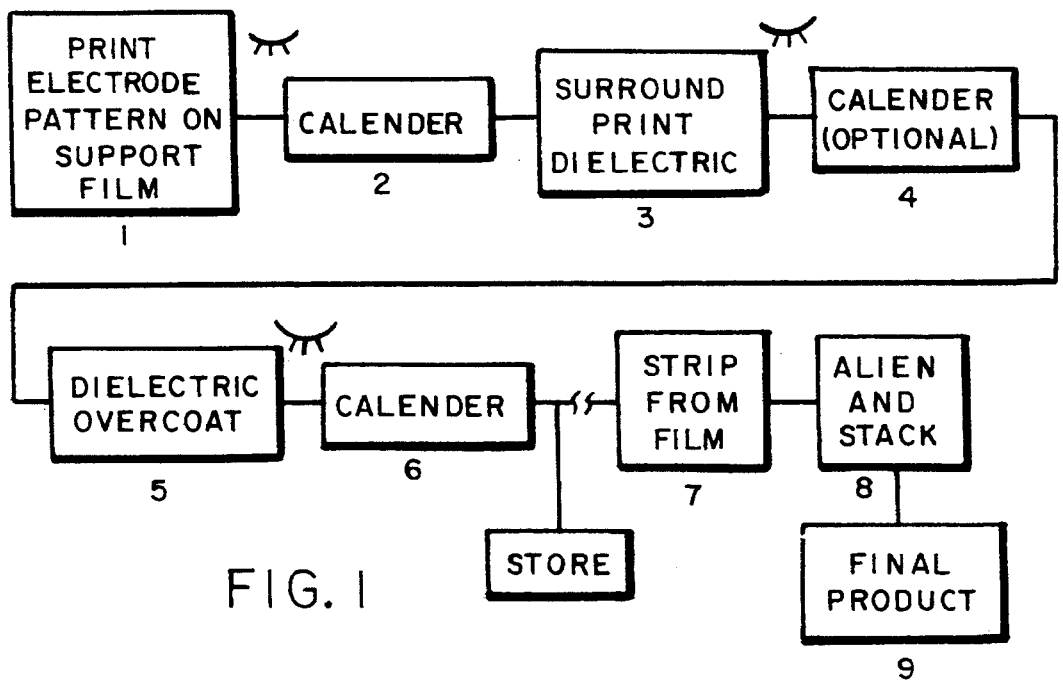
FIG. 1 is a schematic of process flow steps of a preferred embodiment of the invention.
Figure 2:
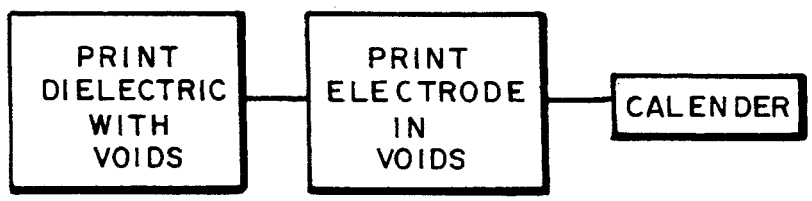
FIG. 2 is a schematic of process flow steps of an alternative embodiment of the invention.

The steps of FIGS. 1 and 2 broadly are well known and need not be described in detail. The specific processing parameters and formulations used to achieve the objects of the invention are described more fully hereinafter.

Referring to FIG. 1, the steps of a process of the preferred embodiment of the invention are shown diagrammatically and comprise printing the electrodes on the support film (step 1), calendering the electrodes (step 2), surround printing the electrodes (step 3), optionally calendering the surround printed electrodes (step 4), overcoating the surround printed electrodes with dielectric overcoat (step 5), and calendering. At this point in the process, the electrode embedded green sheet on a support film may be stored for future use. Subsequently, when used, the electrode embedded green sheet is stripped from the support film (step 7), aligned and stacked (step 8), and formed into the final product (step 9).

Referring to FIG. 2, in an alternative embodiment of the invention, the dielectric is first printed on a support film with voids, the voids corresponding to the electrode pattern. Next, the electrode pattern is printed in the voids and then subsequently the surround printed electrodes are calendered This is a reversal of steps 1 and 3 of the preferred embodiment of the invention as outlined above. Processing continues as described for the preferred embodiment. A typical prior art process and the surround print process are set forth below.

Prior Art Process

1. Cast the dielectric and cut into sheets
2. Stack (bar) build-up process
2A. Add required number of dielectric base sheets to platen
2A. Dielectric sheet placed onto platen or build-up stack
2B. Platen with dielectric sheet moved to low pressure tack press
2C. Platen with sheet after tack press moved to screen print stage
2D. Platen with electrode printed sheet moved into dryer
2E. Platen with dried electrode printed sheet to layer add point. Repeat the 2A through 2E cycle until the required number of printed layers have been added
2F. Add required number of dielectric cap sheets to stack
3. Laminate the stack (bar)
4. Cut the bar into chips
5. Burn-out the chips
6. Fire the chips
7. Inspect the chips and terminate if chips okay to process further
8. Termination fire the chips
9. Test and evaluate the chips prior to further processing

Surround Print Process

1. Print the electrodes onto a roll of carrier film
1A. Dry and calender
2. Surround print the dielectric around the electrodes at about the same height as electrodes previously printed onto the carrier film roll
2A. Dry and Calender
3. Overlay coat surround printed roll with dielectric to desired dielectric layer thickness to produce a roll of surround printed composite green tape
3A. Dry and calender 4. Vista build-up machine process using Vista surround print composite tape roll 4A. Add required number of dielectric base sheets to machine platen 4B. Mount the composite tape roll onto the machine and run the machine until the required number of layers have been added to the stack (bar)

4C. Add required number of dielectric cap sheets to the stack (bar)

5. Laminate the stack (bar)

6. Cut the bar into chips

7. Burn-out the chips

8. Fire the chips

9. Inspect the chips and terminate if chips are okay to process further

10. Termination fire the chips

11. Test and evaluate the chips prior to further processing.

Operation

The process of the preferred embodiment of the invention will be described with reference to FIGS. 5 through 9. The specific materials used, i.e. support film and compositions of electrodes and dielectrics, are set forth under the section EXAMPLES.

Figure 3:
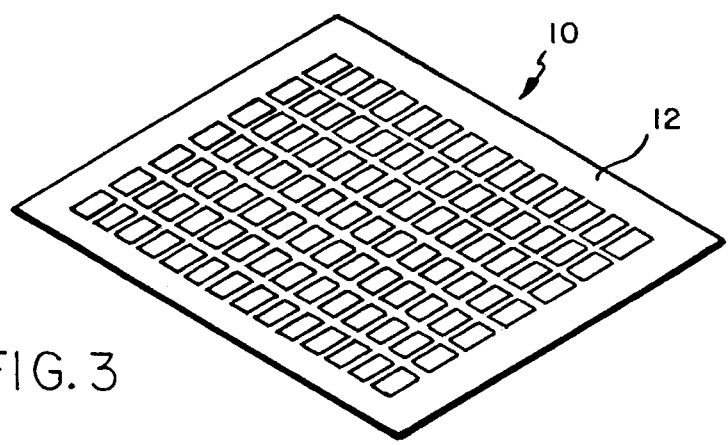
FIG. 3 is an illustration of an electrode pattern printed on a release film.
Figure 4:
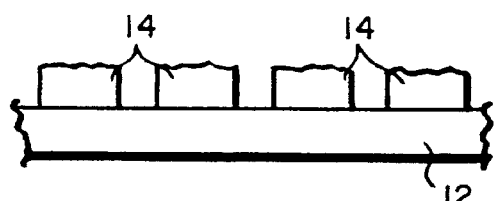
FIGS. 4, 5, 6, 7, 8, and 9 are illustrations of the electrode embedded green sheet as processed according to the steps of FIG. 1.
Figure 5:
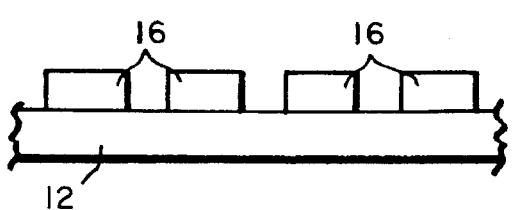
Figure 6:
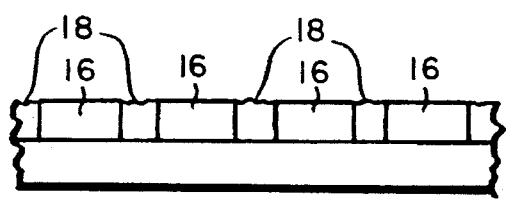
Figure 12:
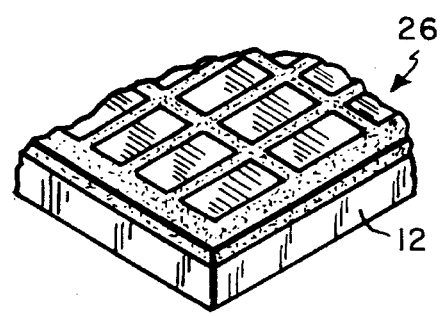
FIG. 12 is a perspective view of a surround printed electrode pattern.
Figure 13:
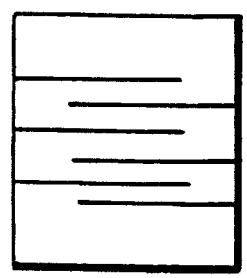
FIG. 13 is a schematic diagram of an electronic component made according to the electrode embedded green sheets of the invention.

Referring to FIG. 3, an electrode pattern 10 is printed on the support sheet 12 and the pattern comprises individual electrodes 14. Referring to FIG. 4, the electrodes 14 are screen printed, say at a thickness of 50 micro-inches on the support sheet. Subsequently, the electrode pattern is dried and calendered at a nip pressure of about 100,000 psi. Generally, the residence time in the dryer and the air temperature are controlled to insure that the support film temperature does not exceed its glass transition temperature which is about 160° F. for most polyester films. Heat or cooling can also be applied during calendering to improve surface smoothness. The calendering step compacts and flattens the surfaces of the electrodes as shown in FIG. 5. The flattened and compacted electrodes are referred to as 16. The lower surface of the electrodes 16 which interface with the support sheet 12 inherently are flatter than the upper surface and therefore, the compaction step primarily flattens the upper surface along with compacting the electrodes 14, as shown in FIG. 5. Subsequently, the electrodes 16 are surround printed, such as by gravure roll, with dielectric 18 as shown in FIG. 6. The dielectric surrounds the electrodes 16 but does not overcoat the electrodes 16. As shown in FIG. 6, regardless of which printing or casting process is used to surround print the dielectric, the upper surface of the dielectric is inherently rough. The dielectric is printed at a thickness of about 50 micro-inches. Subsequently, the surround print dielectric is dried and calendered, say at a nip pressure of 100,000 psi. The density of the surround print dielectric 18 is approximately matched to that of the density of the electrode 16 and after calendering the surround print dielectric, referred to as 20, has an upper surface (and for that matter it's lower surface also) which is coplanar with the upper (and lower) surface of the electrodes 16. This surround printed electrode pattern is shown in FIG. 12.

Figure 7:
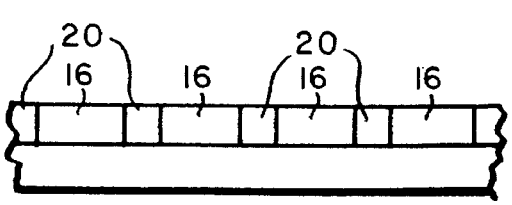
Figure 8:
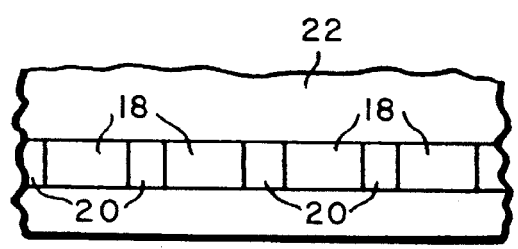
Figure 9:
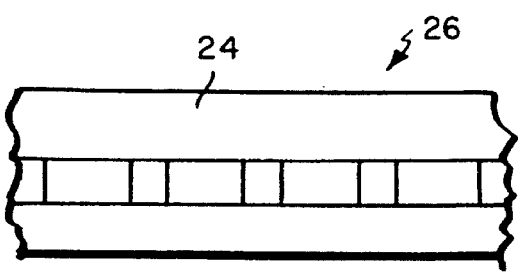

Referring to FIG. 8, an overcoat dielectric 22, typically having the same composition and density of the dielectric 18, overcoats, such as by knife over roll technique, the surround printed electrodes 20 of FIG. 7. The overcoat dielectric 22 is coated at a thickness of 250 micro-inches and in FIG. 9, as compacted, is referred to as 24. This forms the electrode embedded green sheet referred to generally as 26.

As will be apparent to one skilled in the art, the specific thicknesses of the electrodes and surround print dielectric and the overcoated dielectric will depend upon the application for which the capacitor is being designed.

In an alternative embodiment of the invention, the densities of the electrodes and surround print dielectric and/or the overcoat dielectric do not require matched densities prior to the calendering steps but will have approximately matched densities subsequent to the calendering steps.

Figure 10:
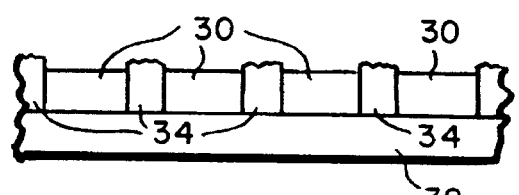
FIG. 10 is a schematic illustration of a surround print electrode pattern where the dielectric surround print is thicker than the electrode pattern.

In FIG. 10, electrodes 30 are shown as printed and calendered on a support sheet 32. Surround print dielectric 34, at a density less than that of the electrodes, surrounds the electrodes but is at a greater height than the electrodes 30. This is prior to the calendering step. After calendering the dielectric 34 would appear as the dielectric 20 in FIG. 7, namely, after compression during the calendering step, the density of the surround print dielectric 34 would substantially match that of the electrodes 30 and the surfaces of the dielectric 34 would be coplanar with the surfaces of the dielectric 30.

Figure 11:
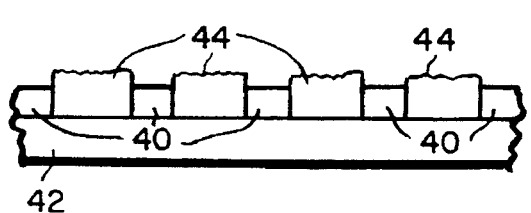
FIG. 11 is an illustration of a surround print electrode pattern where the dielectric electrode pattern is thicker than the surround print.

Referring to FIG. 11, surround print dielectric 40 is cast on a support sheet 42, calendered and dried. Subsequently, electrodes 44 of a different density, prior to calendering, than that of the surround print dielectric 40 are cast in the voids defined by the dielectric. After calendering, the electrodes 44 have a density which approximately matches that of the surround print dielectric 40 and the electrodes have their surfaces coplanar with the surfaces of the dielectric 40 in the same manner as shown for the surround print electrode sheet of FIG. 7.

In the process of the invention, the densities of the electrodes and dielectric, particularly the surround print dielectric, are matched as closely as possible to ensure the flatness of the electrode and surround print dielectric. That is, after the calendering of both the electrodes and the surround print dielectrics, both their upper surfaces, as shown in FIG. 7, and their lower surfaces (interfacing with the support film) are coplanar. As the green sheets are stacked in the lamination process the pillowing or mounding of the sheets is avoided. Further, the flatness of the electrodes, the surround print dielectric layers and also of the overcoated dielectric layer, after calendering, do not vary more than 5 to 10% within the design thickness. That is, if the design thickness of the electrode is 100 micro-inches, the finally calendered electrode will be 100 micro-inches plus or minus 5% to 10%. Similarly, the same range would be applicable for the surround print dielectric and also for the overcoated dielectric.

Generally, the density of either cast or coated dielectric material prior to calendering or lamination is about 3.8 grams per cc. The coated material may be slightly more dense but the difference is not as great as it might be due to the different solids levels and amounts of solvents used. A lower viscosity is used for coating dielectric or ink formulations than for cast or screen printing which usually means more solvent content. Densities are also a function of the type of dielectric being used.

Typically, the density in gm/cc, of an X7R dielectric formulation would be:

| As Cast | 3.75 to 3.8 | As Coated | 3.78 to 3.82 |
| After Lamination | 3.85 to 3.9 | After Calendering | 4.0 to 4.2 |

The after lamination density is not precisely known since some manufacturers use hydraulic or pneumatic presses and others use isostatic presses, which generally are at a higher pressure than for a ram press. In any event the densities don't reach the 4.0+ range since even for isostatic presses the pressures are less than for calendering.

In prior art MLC manufacturing, depending upon the design requirements of the capacitor to be manufactured which are typically based on voltage, electrodes can be printed, such as by screen printing, at a typical thickness range between 150 of 250 micro-inches with the dielectric overcoat ranging between 750 to 1500 micro-inches. After the stacking of the electrode coated green sheets and lamination, the corresponding electrode thickness can range between 142 to 237 micro-inches while the dielectric between the electrodes can range between 712 to 1425 micro-inches. This would be whether a hydraulic press, say at 500 psi were used, or an isostatic press at about 2500 psi were used. The reason for compacting using an isostatic press is to apply pressure uniformly to part surfaces so that the deposited shape is retained. For this reason, because of the higher pressures, the use of isostatic passing is generally considered superior to the use of a hydraulic press. However, as is apparent, in the prior art MLC manufacturing process, there is little smoothing and/or compaction of the electrodes and/or dielectric layers so that isostatic pressing alone does not solve the problem of deposited shape irregularities. With the present invention, the surface irregularities are reduced or eliminated prior to the pressure lamination step. Thus, the inventive improvement is maintained regardless of whether a hydraulic ram press or isostatic press is used.

Also, with the present invention, utilizing the calendering step subsequent to: the printing of the electrodes, the printing of the surround print dielectric, the overcoating of the dielectric and the drying after each step, the following would be typical ranges whether the electrodes are screen printed or printed by gravure roll. The electrodes can be applied in the range of 40 to 100 micro-inches. After calendering, they would range from 37 to 92 micro-inches with a calendering pressure of between 100K psi or 250K psi and a drying range of 50° to 60° C. The surround print dielectric can originally be cast between 45 to 108 micro-inches and after calendering, under the same conditions as for the electrodes, would range between 37 to 92 micro-inches, thus ensuring that the upper surfaces of the electrode and surround print dielectric are co-planar. Lastly, the dielectric overcoat is calendered and dried in the same range as for the first two steps and is applied in a range of 250 to 1500 micro-inches and compacted to 235 to 1400 micro-inches. In the process of the invention, the lamination pressure subsequent to stack build-up is less than the calendering pressures applied during the formation of the green sheets.

The compression, which results in both increased density and decreased thickness, is between 5 and 20% for all three calendering steps (electrodes, surround print dielectric and overcoat dielectric). The compression is somewhat dependent upon the type of metal powder used in the formulation. The compression achieved also varies depending on the pressure applied during densification.

For conventional screen printing of electrodes, typically an electrode paste having 40 to 70% solids by weight is used with viscosities ranging from 25,000 to 60,000 centipoises. With conventional screen printing, the electrodes are 150 to 250 micro-inches high and these are compacted slightly as the layers are lightly pressed during the build-up process as new unprinted layers of dielectric are added to the stack and printed. Since the pressure at this step is so low there is little, if any, "machining" impact on the electrode. There is further compaction during the lamination step where high pressures (400 to 1500 psi) are applied to the built-up stack or bar with a conventional ram press or 2000 to 3000 psi with an isostatic press. Again, because the pressure is applied to the stack and not directly to the electrodes, the electrode surface is not made flatter or "machined". The amount of electrode compaction achieved by pressing the total stack made of layers of electrodes printed on dielectric is 5 to 25% less than that from the inventive process disclosed herein.

The nip pressures applied to the electrodes during calendering (densification and flattening) by the inventive process exceed 100,000 to 200,000 psi. Further the electrode is compressed, using similar pressures, a second time when the surround print dielectric is densified and then compressed a third time again after the overlay dielectric coating is applied.

The electrode paste used in the present process can be 30 to 88% solids depending on which type of printer is used. For screen-printing, typically, there are 50% solids, the viscosities range from 25,000 to 45,000 centipoises measured with a Brookfield HBT 5X cone and plate viscometer using a 1.565° cone and the height of the electrodes is 40 to 150 micro-inches for dielectric layer thicknesses ranging from 200 to 2000 micro-inches.

During drying and densification, more of the organics are removed by the disclosed process than by conventional processes. In conventional processes, little drying or compaction of the electrode is done prior to covering with the next dielectric layer. Further there is a graduation of compaction and drying with the lowest electrode print having the greatest number of exposures to repetitive drying and light compaction and the upper electrode having the least. In the disclosed process, all electrodes see the same amount of drying and compaction.

The electrodes usually have a higher non-organic content compared to the dielectric and therefore will usually compact less when the same force is applied. For this reason when a stack of electrode printed sheets are compressed either by a conventional press or isostatically, the dielectric is compressed around the electrode so that little, if any, surface modification (machining) of the electrode results. The pressure does serve to force the dielectric to deform around the electrode but the dielectric is generally not elastic enough to flow easily, so again, voids are left as the electrode is not forced completely into or surrounded by the dielectric. The "as printed and un-densified" electrodes in a conventionally processed stack have more organic to be removed during burn-out and firing which results in a higher porosity.

In the disclosed process, the electrodes have at least 7% less organics than conventional electrodes. Further, the shrinkage of a chip formed from green sheets of the invention during firing is 10 to 30% less in the X-Y plane than for chips made the conventional way. Z direction shrinkage is also less. Because conventional electrodes are only lightly compacted prior to the stacking process, the overlaying electrodes are higher and tend to distort the surface more as layers are added. This tends to limit the number of layers within a stack or bar because as the surface becomes too rough, it is impossible to accurately align the layers. This misalignment of the electrodes causes reduced yields for a variety of reasons such as shorts, delamination, out of specification capacitance and insulation resistance.

The carrier film surface treatment typical in the prior art can be omitted either by use of a carrier such as polypropylene film to which the coating does not stick or by incorporating certain chemical agents into the coating formulation to facilitate the release of the dried and calendered coating from the carrier.

The following examples describe electrode and dielectric formulations which have compatible densities and the chemical and physical characteristics to achieve the composition, flatness and surface characteristics desired.

EXAMPLES

A suitable formula is considered to be either low fire or high fire in the industry depending on the firing temperature to be used. Generally, high fire formulations have the ingredients that will provide the desired properties when fired at higher temperatures, e.g. 1175° C. to 1400° C. The result is that the ink formulations use palladium metal rather than a silver-palladium alloy or mixture and the dielectric formulations have fewer additives than are required for low fire formulations. Low fire formulations are between 1025° C. to 1150° C.

Low fire electrode formulations can have a density of between 3.5 to 5.0 gm/cc prior to calendering and a density of 4.0 to 6.0 gm/cc after calendering. Low fire dielectric formulations can have a density of between 3.0 to 4.5 gm/cc prior to calendering and 3.5 to 5.5 gm/cc after calendering.

Densities are considered approximately matched or compatible wherein the densities do not vary more than approximately ten percent (10%) from one another. Density variations of from zero percent (0%) to ten percent (10%) have been found to be suitable for purposes of this invention.

Low fire electrode ink formula

|  | WEIGHT % | RANGE |
|---|---|---|
| #3030 Degussa Metz Corporation 70% silver and 30% palladium powder | 50 | 35–55 |
| FHEC Aqualon Corporation thermoplastic resin | 10 | 4.5–14 |
| #318 Hercules Incorporated terpeneol | 40 | 35–50 |

Density prior to calendering High fire electrode ink formula

|  | WEIGHT % | RANGE |
|---|---|---|
| GPZ-004 Degussa Metz 100% palladium powder | 50 | 35–55 |
| EHEC Aqualon Corporation thermoplastic resin | 10 | 4.5–14 |
| #318 Hercules Incorporated terpeneol (solvent) | 40 | 35–50 |

Other suitable resins: N-50 Hercules Incorporated ethylcellulose.

Other suitable solvents: Shell Incorporated and Exxon Incorporated aromatic and aliphatic hydrocarbons and Union Carbide Company and Dow Chemical Company propylene glycol ethers.

Typical low fire ceramic dielectric formulations

|  | WEIGHT % | RANGE |
|---|---|---|
| Tamron 262L, Tam Ceramics, Incorporated ceramic dielectric powder | 60 | 55–64 |
| B73210 Ferro/MSI binder solution; or | 40 | 36–45 |
| #900NL Ferro Corporation ceramic dielectric powder | 60 | 55–64 |
| B-76 Monsanto Corporation thermoplastic resin | 9 | 4–11 |
| dioctyl Phthalate Monsanto Corporation plasticiser | 5 | 0.5–6.0 |
| Staley Chemical Corporation Stasol brand dispersing agent | 1 | 0–3 |
| Solvents such as Methyl Ethyl Ketone; | 25 | 20–40 | or

High fire ceramic dielectric formula

Using the same formulation as above except substitute for the low fire dielectric powder a high fire dielectric power such as one of the Kyoritsu powers below.

Kyoritsu Ceramic Materials Company, Ltd., MCC-B 35 J high fire X7R dielectric powder Kyoritsu Ceramic Materials Company, Ltd., MCC-YF 100 H high fire Y5V dielectric powder.

Other suitable ceramic dielectric powders:

TAM ceramic PL 802, low fire Y5V dielectric powder;

Ferro Corporation XJ 4000 low fire X7R dielectric powder;

Other suitable resins:

Rohm & Haas Incorporated 5–7 butylmethacralate resin;

Air Products Incorporated Vinol polyvinyl alcohol resin; and

Hercules Incorporated N-50 ethylcellulose resin.

Other suitable plasticizers:

Monsanto Corporation S-160 butyl benzyl phthalate;

Commercial dibutyl phthalate; and

Commercial glycerin.

Other suitable dispersants:

Rhone Poulenc Phosfac RE-410; and

Commercial Menhaden oil.

Other suitable solvents by several chemical supply companies:

Toluene, xylene, acetone, ethanol (denatured), and 1,1,1 trichloroethane.

The release films are silicone treated polyester films commercially available from Release Technologies, Coating and Laminates and Futaba Chemical and sold to the electronic industry for use as a carrier film to support cast coatings such as dielectrics for electronic substrates. The degree of treatment (amount of silicone or other release agent per square inch of film surface) varies depending on the degree of adhesion desired by the customer.

The foregoing description has been limited to a specific embodiment of the invention. It will be apparent, however, that variations and modifications can be made to the invention, with the attainment of some or all of the advantages of the invention. Therefore, it is the object of the appended claims to cover all such variations and modifications as come within the true spirit and scope of the invention.

Having described our invention.

It is claimed:

1. A method of making an electrode embedded green sheet which comprises:

printing electrodes on a support sheet;

surrounding said electrodes with a first surround print dielectric layer without overcoating said electrodes to form surround printed electrodes;

drying the first surround print dielectric layer;

calendering said surround printed electrodes and said first surround print dielectric layer to densify the electrodes and the dielectric and to flatten the upper surfaces of said electrodes and said dielectric; and coating a second dielectric layer over said surround printed electrodes to form an electrode embedded green sheet.

2. The method of claim 1 which comprises:

calendering said electrodes before surrounding the electrodes with the first dielectric layer.

3. The method of claim 2 which comprises:

drying said electrodes.

4. The method of claim 2 which comprises:

calendering the surround print dielectric layer.

5. The method of claim 4 which comprises:

drying the calendered surround print dielectric.

6. The method of claim 1 which comprises:

calendering the second dielectric layer.

7. The method of claim 1 which comprises:

coating the support sheet with the first dielectric layer prior to printing the electrodes, the first dielectric layer characterized by voids therein arranged in a pattern; and printing subsequently the electrodes in the voids in the first dielectric layer.

8. The method of claim 1 wherein the densities of the electrodes and surround print dielectric are such that the thicknesses and densities of the electrodes and the surround print dielectric are substantially the same after calendering.

9. The method of claim 8 wherein the electrodes and the surround print dielectric are compressed to between about 5 to 20% of their original thickness and the surfaces of the electrodes and surround print dielectric after calendering are coplanar.

10. The methods of claim 8 which comprises:

printing the eletrodes on the support sheet at a first thickness;

surrounding the electrodes with the surround print dielectric at a second thickness, the first and second thicknesses being distinct one from the other;

calendering the surround printed electrodes, the densities of the electrodes and surround print dielectric characterized in that subsequent to the calendering step, whereby the surfaces of the electrodes and the surround print dielectric are substantially coplanar.

* * * * *